(12) United States Patent
Van Der Sanden et al.

(10) Patent No.: US 8,976,355 B2
(45) Date of Patent: Mar. 10, 2015

(54) METHOD OF APPLYING A PATTERN TO A SUBSTRATE, DEVICE MANUFACTURING METHOD AND LITHOGRAPHIC APPARATUS FOR USE IN SUCH METHODS

(75) Inventors: Stefan Cornelis Theodorus Van Der Sanden, Nijmegen (NL); Richard Johannes Franciscus Van Haren, Waalre (NL); Hubertus Johannes Gertrudus Simons, Venlo (NL); Remi Daniel Marie Edart, Eindhoven (NL); Xiuhong Wei, Eindhoven (NL); Michael Kubis, Düsseldorf (DE); Irina Lyulina, Son (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/597,806

(22) Filed: Aug. 29, 2012

(65) Prior Publication Data

US 2013/0230797 A1 Sep. 5, 2013

Related U.S. Application Data (60) Provisional application No. 61/540,161, filed on Sep. 28, 2011.

(51) Int. Cl.
*G01B 11/00* (2006.01)
*G03F 9/00* (2006.01)
(Continued)

(52) U.S. Cl.
CPC .......... *G03F 7/70141* (2013.01); *G03F 9/7003* (2013.01); *G03F 9/7088* (2013.01); *G03F 7/70633* (2013.01)
USPC ............................... 356/401; 430/22; 430/30

(58) Field of Classification Search
None
See application file for complete search history.

(56) References Cited

U.S. PATENT DOCUMENTS 5,498,501 A * 3/1996 Shimoda et al. ................ 430/22
5,525,808 A * 6/1996 Irie et al. ....................... 250/548
(Continued)

FOREIGN PATENT DOCUMENTS

CN 1242104 A 1/2000
JP 08-162392 A 6/1996
(Continued)

OTHER PUBLICATIONS

Chang, R. C., et al., "Throughput Improvement from Routing Reduction by Using CPE (Correction Per Exposure)," Proceedings of SPIE, Lithography Asia 2008, vol. 7140, Dec. 2008, pp. 714043-1 to 714043-9.

(Continued)

*Primary Examiner* — Gordon J Stock, Jr.
(74) *Attorney, Agent, or Firm* — Sterne, Kessler, Goldstein & Fox P.L.L.C.

(57) ABSTRACT

A substrate is loaded onto a substrate support of a lithographic apparatus, after which the apparatus measures locations of substrate alignment marks. These measurements define first correction information allowing the apparatus to apply a pattern at one or more desired locations on the substrate. Additional second correction information is used to enhance accuracy of pattern positioning, in particular to correct higher order distortions of a nominal alignment grid. The second correction information may be based on measurements of locations of alignment marks made when applying a previous pattern to the same substrate. The second correction information may alternatively or in addition be based on measurements made on similar substrates that have been patterned prior to the current substrate.

8 Claims, 7 Drawing Sheets

(51) Int. Cl.
*G03C 5/00* (2006.01)
*G03F 7/20* (2006.01)

(56) References Cited

U.S. PATENT DOCUMENTS

| | | | | |
|---|---|---|---|---|
| 5,561,606 | A * | 10/1996 | Ota et al. | 716/55 |
| 5,656,402 | A * | 8/1997 | Kasuga | 430/22 |
| 5,674,651 | A * | 10/1997 | Nishi | 430/22 |
| 6,278,957 | B1 | 8/2001 | Yasuda et al. | |
| 6,528,219 | B1 * | 3/2003 | Conrad et al. | 430/22 |
| 6,801,825 | B2 * | 10/2004 | Utsunomiya | 700/121 |
| 7,126,669 | B2 * | 10/2006 | Edart | 355/55 |
| 7,177,008 | B2 | 2/2007 | Nishi et al. | |
| 7,190,456 | B2 * | 3/2007 | Yamamoto | 356/401 |
| 7,415,319 | B2 * | 8/2008 | Werkman et al. | 700/121 |
| 7,718,327 | B2 * | 5/2010 | Okita | 430/22 |
| 7,842,442 | B2 | 11/2010 | Seltmann et al. | |
| 8,130,362 | B2 * | 3/2012 | Kawakubo | 355/53 |
| 8,711,329 | B2 * | 4/2014 | Van Kemenade | 355/53 |
| 2002/0042664 | A1 | 4/2002 | Kikuchi | |
| 2003/0059691 | A1 * | 3/2003 | Morimoto | 430/22 |
| 2003/0235330 | A1 * | 12/2003 | Tanaka | 382/151 |
| 2006/0206279 | A1 * | 9/2006 | Park et al. | 702/94 |
| 2007/0109524 | A1 * | 5/2007 | Kawakubo et al. | 355/77 |
| 2007/0133864 | A1 * | 6/2007 | Morimoto | 382/151 |
| 2007/0159632 | A1 * | 7/2007 | Shibazaki | 356/401 |
| 2010/0030360 | A1 * | 2/2010 | Habets et al. | 700/110 |
| 2012/0133913 | A1 * | 5/2012 | Okita | 355/30 |

FOREIGN PATENT DOCUMENTS

| | | |
|---|---|---|
| JP | 2001-176769 A | 6/2001 |
| JP | 2001-274073 A | 10/2001 |
| JP | 2001-345243 A | 12/2001 |
| JP | 2010-502024 A | 1/2010 |
| JP | 2010-067988 A | 3/2010 |
| JP | 2010-074075 A | 4/2010 |
| JP | 2010-186918 A | 8/2010 |

OTHER PUBLICATIONS

Huang, C.-Y., et al., "Overlay Improvement by Zone Alignment Strategy," Proceedings of SPIE, Metrology, Inspection, and Process Control for Microlithography XXII, vol.6922, Mar. 2008; pp. 69221G-1 to 69221G-8.

* cited by examiner

METHOD OF APPLYING A PATTERN TO A SUBSTRATE, DEVICE MANUFACTURING METHOD AND LITHOGRAPHIC APPARATUS FOR USE IN SUCH METHODS

CROSS REFERENCE TO RELATED APPLICATIONS

This application claims the benefit under 35 U.S.C. §119 (e) to U.S. Provisional Patent Application No. 61/540,161, filed Sep. 28, 2011, which is incorporated by reference herein in its entirety.

BACKGROUND

1. Field of the Invention

The invention relates to method of transferring a pattern from a patterning device onto a substrate using a lithographic apparatus, to a device manufacturing method. The invention further relates to a lithographic apparatus constructed and arranged to carry out the method, and to a computer program product for controlling a lithographic apparatus to implement steps of the method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor or other products. Various steps have been taken to mitigate these delays in the prior art. Nevertheless, an overhead is still incurred which limits the throughput that can be achieved.

As pattern features become smaller and overlay performance requirements become ever more demanding, so-called advanced alignment models have been and continue to be developed to model and correct more accurately non-linear distortions of the wafer 'grid'. These advanced models depend however on measuring an increased number of targets across the wafer, which is naturally more time-consuming, and further limits the throughput of the lithographic process as a whole. For coming production nodes (for example 28 nm and below), it is believed process-induced wafer grid deformation will become a more significant contributor to overlay error. Consequently the overlay of any critical layer should ideally be controlled with advanced alignment models. At the same time, it is known that the usage of advanced alignment models increases the need for alignment information and decreases productivity, simply because more alignment marks (targets) have to be measured to secure sufficient data as input for the complex applied alignment model. The additional measurement overhead therefore threatens to reduce the throughput of processes achieving the highest overlay performance.

Additionally, when advanced alignment is used (to meet the overlay requirement), the subsequent layer has to follow this per wafer alignment induced wafer grid corrections to meet overlay specifications. This will continue for all subsequent product layers until overlay can absorb the penalty.

BRIEF SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

It is desirable therefore to further mitigate the measurement overhead in a lithographic process, while retaining the performance benefits of higher order corrections. In one aspect, the invention provides a method of transferring a pattern from a patterning device onto a substrate, the method comprising:

(a) providing in a lithographic apparatus a patterning subsystem for applying the pattern from the patterning device to at least a portion of the substrate held at a patterning location;

(b) loading the substrate on a substrate support within the lithographic apparatus (c) after step (b) measuring the locations of a number of alignment marks on the substrate; and (d) after step (c) operating the lithographic apparatus to apply the pattern at one or more desired locations on the substrate, wherein the step (d) includes using correction information to define the location(s) where the pattern is applied, wherein the correction information comprises first correction information based on the results of the measuring step (c) and second correction information based on measurements made prior to step (b) of locations of alignment marks on at least one of (i) the same substrate and (ii) a plurality of similar substrates.

The first and second correction information together can define local positional corrections in more detail than is available from the measuring step (c). The first correction may comprise a grid correction model having no more than ten, optionally no more than six parameters. The second correction information may comprise a grid correction model having more than 15 or more than 30 parameters. The first and second correction information relate particularly to the substrate and how it is mounted in the apparatus. They will typically be used in combination with process corrections, related to distortions introduced by the lithographic apparatus and other steps in the overall lithographic process.

In one embodiment, the first correction information defines a first set of positional corrections that are calculated from the results of the measuring step (c) and the second correction information defines a second set of positional corrections that are calculated at least partially on the basis of the measurements made prior to step (b), and the first and second sets of positional corrections are applied in combination in the performance of step (d).

In some known lithographic apparatuses, a set of positional corrections can be stored and applied as a 'correction per exposure' (CPE) recipe, and added to other corrections. An example of application of a CPE recipe to correct a particular form of distortion is described in a paper by Chang et al, "Throughput improvement from routing reduction by using CPE (correction per exposure)," Proc. SPIE 7140, 714043 (2008). According to the abstract, manually generated overlay corrections are applied as a 'workaround' to improve overlay in edge fields while avoiding additional measurement time. These corrections would be based on measurement of overlay error on substrates measured after the lithographic process has been used to apply two pattern layers.

In another embodiment, the results of the measuring step (c) are combined with results of the measurements prior to step (b) and used to calculate a single set of positional corrections incorporating the first and second correction information.

The second correction information may comprise one of a polynomial alignment model, a zone-alignment model and a radial basis function model.

In one application of the invention, the second correction information is based at least partially on measurements of locations of alignment marks on the same substrate, the measurements having been made while applying a previous pattern to the substrate. In this way, an advanced alignment model used in a first critical layer can be re-used in applying the pattern for a second layer, without the same measurement overhead.

In another application of the invention, the second correction information is based at least partially on previously made measurements of locations of alignment marks on one or more substrates to which the same pattern has previously been applied. In this way, information measured from earlier substrates can be accumulated to support the use of an advanced alignment model, without incurring the increased measurement overhead for every substrate.

The measurements made in step (c) are processed together with the results of the previously made measurements, to generate enhanced second correction information for use in applying the pattern to a subsequent substrate.

In the above embodiments, the collection of the previously made measurements and the generation, storage and retrieval of the second correction information can be performed automatically by a computerized controller of the lithographic apparatus.

The invention further provides a device manufacturing method comprising transferring a pattern from a patterning device onto a substrate, by a method as set forth above and processing the substrate to create product features in accordance with the applied pattern.

The invention further provides a lithographic apparatus arranged to transfer a pattern from a patterning device onto a substrate, the apparatus comprising:

a patterning subsystem for receiving the patterning device and applying the pattern to a portion of the substrate held at a patterning location;

a substrate support for holding the substrate while the pattern is applied;

a measurement subsystem for measuring the locations of alignment marks on the substrate relative to a reference frame of the apparatus; and a controller for operating the lithographic apparatus to apply the pattern at one or more desired locations on a substrate held on the substrate support, the controller being arranged to generate first correction information based on the locations of alignment marks measured by the measurement subsystem after loading the substrate on the substrate support, to retrieve from a data store second correction information based on measurements of alignment marks made prior to loading the substrate, and to use the first and second correction information in combination to position the applied pattern at the desired location.

The apparatus can be adapted to implement the embodiments and applications of the invention set out in relation to the method described above.

The controller may be arranged to generate and store the second correction information automatically based at least partially on measurements made using the measurement subsystem of locations of marks on one or more substrates to which the same pattern has previously been applied.

The controller may be arranged automatically to process the measurements made after the substrate is loaded together with the results of the previously made measurements, to generate and store enhanced second correction information for use in applying the pattern to a subsequent substrate.

The lithographic apparatus may comprise at least two substrate supports, and wherein the controller is arranged to perform patterning on one substrate using one substrate support, while concurrently performing the measurements of locations of alignment marks on another substrate using the other of the substrate supports.

The invention yet further provides a computer program product containing one or more sequences of machine-readable instructions for controlling one or more lithographic apparatuses, the instructions being adapted for controlling the apparatuses to implement a method as set forth in any of the aspects and embodiments of the invention above.

The invention yet further provides a computer program product containing one or more sequences of machine-readable instructions for causing a data processing unit to implement the controller of a lithographic apparatus, as set forth in any of the aspects and embodiments of the invention above.

According to another aspect of the invention, there is provided a computer program product containing one or more sequences of machine-readable instructions for controlling a lithographic apparatus, the instructions being adapted for controlling the measurement and positioning steps of a method as set forth in any of the aspects and embodiments of the invention above.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF EXEMPLARY EMBODIMENTS

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function. It is expected that those skilled in the art with access to the teachings provided herein will recognize additional modifications, applications, and embodiments within the scope thereof and additional fields in which the invention would be of significant utility.

Figure 1:
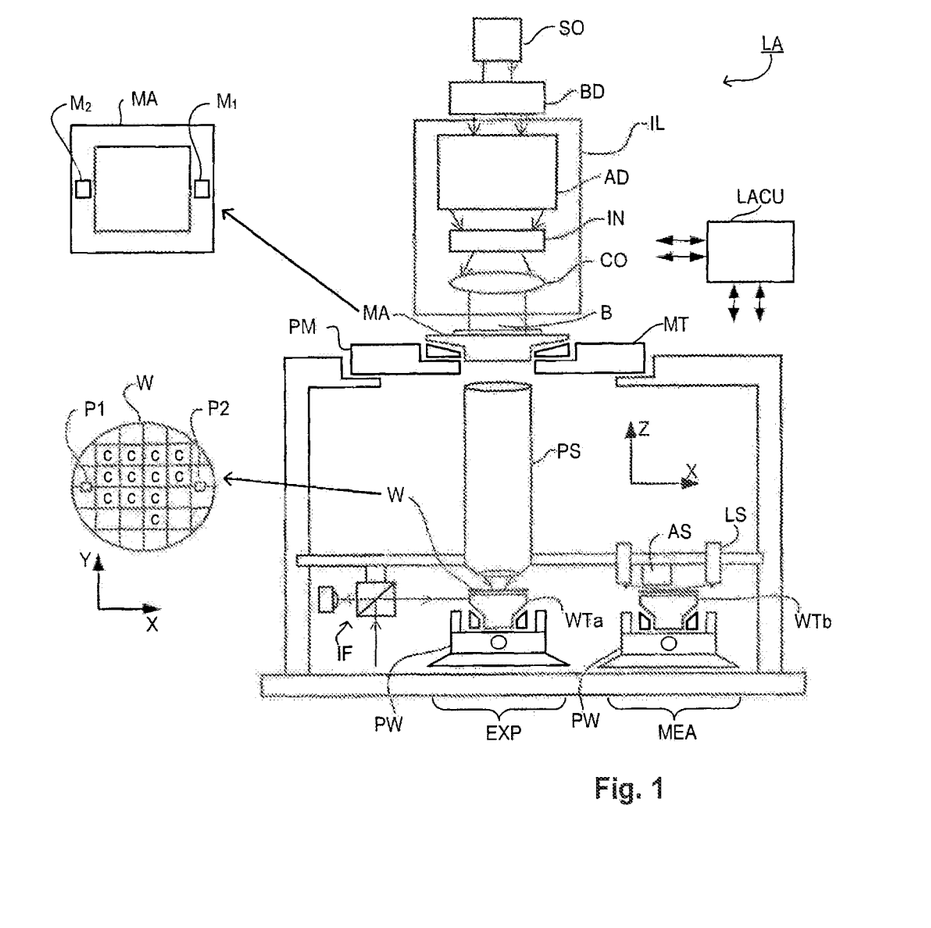
FIG. 1 depicts a lithographic apparatus according to an embodiment of the invention.

FIG. 1 schematically depicts a lithographic apparatus LA according to one embodiment of the invention. The apparatus comprises:

- an illumination system (illuminator) IL configured to condition a radiation beam B (e.g., UV radiation or EUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WTa or WTb constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WTa/WTb can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e., a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e., a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
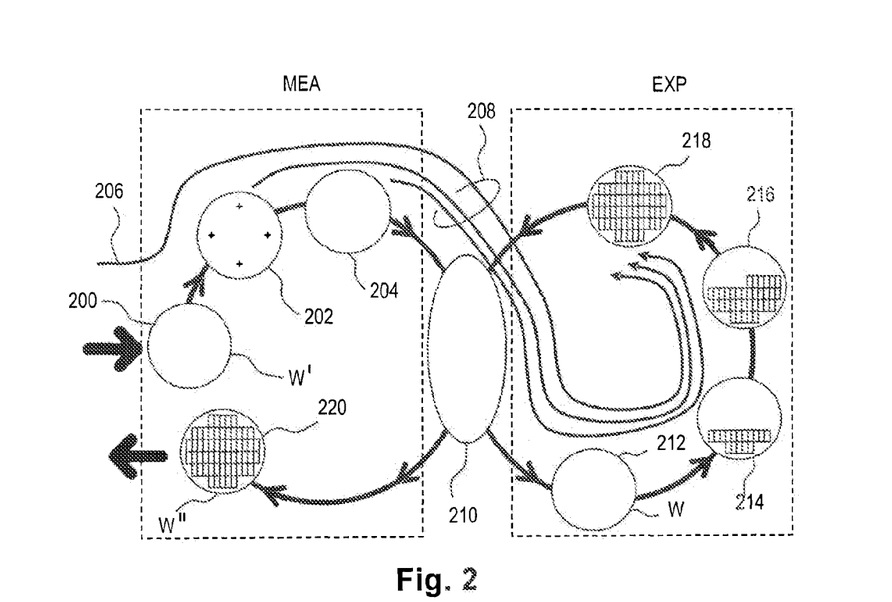
FIG. 2 schematically illustrates stages in the measurement and exposure processes in the apparatus of FIG. 1, according to known practice.

FIG. 2 illustrates the known steps to expose target portions (e.g., dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 (FIG. 1) etc. and image sensors (not shown) are used to measure and record alignment of the substrate relative to substrate table WTa/WTb. In addition, several alignment marks across the substrate W' will be measured, to establish a "wafer grid," which maps very accurately the distribution of marks across the substrate, including any distortion relative to a nominal rectangular grid. At step 204, a map of wafer height against X-Y position is measured also, for use in accurate focusing of the exposed pattern.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, wafers W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Advanced Alignment Models

By employing the separate substrate tables WTa, WTb, the performance of the apparatus in terms of substrate throughput through the exposure stages is maintained, while permitting a standard set of measurements to be performed to characterize each wafer and the patterns previously deposited upon it. Current standard alignment models have six parameters (effectively three per direction X & Y) and in addition there are more advanced alignment models. On the other hand, for the most demanding processes currently under development, to achieve the desired overlay performance requires more detailed corrections of the wafer grid. Advanced alignment models have been developed for this purpose. In this text, 'advanced' alignment models refers to all type of models with more complexity than the standard six parameters. While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on third and higher order polynomial functions. Zone alignment is described for example in Huang et al, "Overlay improvement by zone alignment strategy," Proc. SPIE 6922, 69221G (2008). RBF modeling is described in our co-pending U.S. patent application 61/446,797, filed 25 Feb. 2011 (not published at the present priority date). Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

Even in embodiments with multiple substrate tables WTa/WTb, the time taken to obtain sufficient measurements for advanced alignment on each wafer eventually impacts throughput. Reducing the time per measurement tends to decrease the accuracy of each measurement, so that the impact on throughput is hard to avoid. In addition, once corrections have been applied in one layer using an advanced alignment model, the same level of detail should be applied in subsequent layers, or the corrections in the first layer become a source of error in the overlay of subsequent layers. The manufacturer therefore has a difficult choice whether to accept further measurement overhead by using the advanced model in subsequent layers, or to suffer an overlay penalty by reverting to a simpler alignment model in subsequent layers, measuring fewer marks.

Storage & Re-Use of Alignment Data

In order to understand the novel steps described below, it should be noted that the wafer grid information measured on wafer W at step 202 is discarded after that wafer W is exposed. Consequently, each wafer W, W', W" requires similar measurements to be made for each exposure. Similarly, each wafer W needs to be measured again before it is exposed again to form a subsequent product layer. The inventors have recognized that various opportunities exist for re-using the wafer grid information obtained during the alignment measurement (step 202). One application of this concept is to enable advanced alignment models to be used to improve accuracy, without the direct increase in measurement overhead that would normally be associated with such models.

Figure 3:
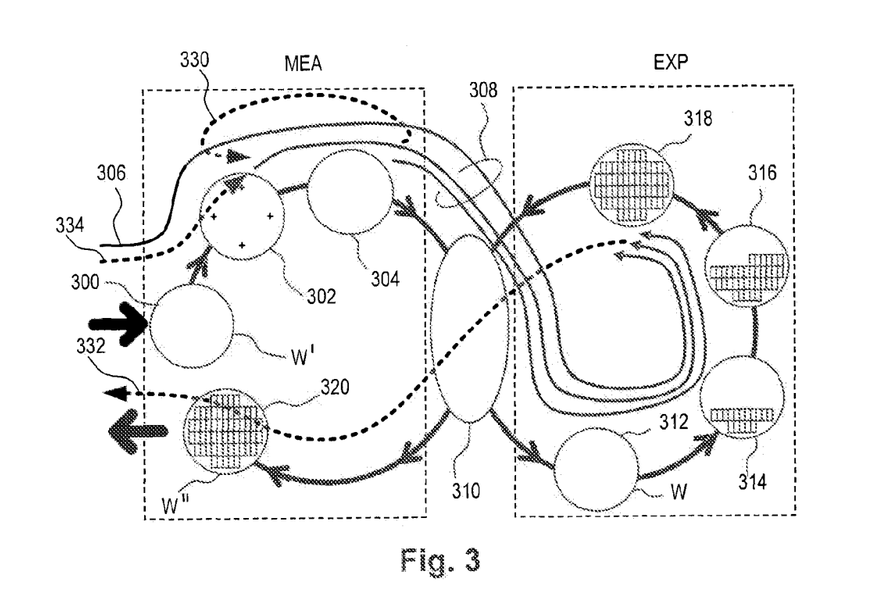
FIG. 3 schematically illustrates stages in the measurement and exposure processes in the apparatus of FIG. 1, according to certain embodiments of the present invention.

FIG. 3 illustrates some modifications of the process of FIG. 2, that can be used to provide more detailed wafer grid information without the expected penalty in throughput. Steps 300-320 are substantially similar to the steps 200-220 of the known process. A first modification is seen in the dotted data path at 330. The wafer grid information measured on wafer W in step 202 is not discarded but is saved for use with a subsequent wafer W'. Provided the wafers are similar, having the same product pattern and processing history, for example, a large component of the distortions that are represented in the wafer grid should be consistent from wafer to wafer, at least within a lot (batch). By re-using this component of the information, corrections of alignment can be applied without repeating the same measurements on every wafer. Measurements on subsequent wafers can be fewer, or they can be replaced by different measurements, accumulating a more detailed model or 'fingerprint' of the distortions at each exposure. The accumulated model may be more detailed in terms of wafer (interfield) fingerprint and/or intrafield distortions.

Another modification of the process is represented by data paths 332 and 334. At 332 the wafer grid information measured on wafer W" (for example) is exported and stored after the wafer has been exposed. At 334 the stored data is imported and used as part of the wafer grid information for a subsequent layer on the same wafer W'. This data can be used to reduce measurement time on subsequent wafers in the same or similar lots, in the same way as the data 330. The data can be used to apply corrections per wafer in across different lots, when a wafer-to-wafer pattern of corrections is consistent from lot to lot. For example, a certain grid distortion may be characteristic of the second wafer (wafer 2) in each lot, and may be stored and applied as a correction to the wafer 2 in each lot, while a different correction or different combination of corrections is applied to other wafers. Alternatively, or in addition, this exported data can be used as wafer grid information when exposing a subsequent layer on the same wafer (or lot of wafers). The data imported at 334 may then be imported into a similar lithography tool or a very different type of lithography tool. Provided the stored data distinguishes distortions of the wafer grid from distortions that are fingerprints of the different tools and processes used, it may be re-used to obtain good alignment and overlay performance, without repeating the measurements that would normally be required to obtain such performance.

The principles described above can be applied in various ways, some of which will now be described by way of example.

Application Example

Re-Use of Grid Information from Previous Layer

Figure 4:
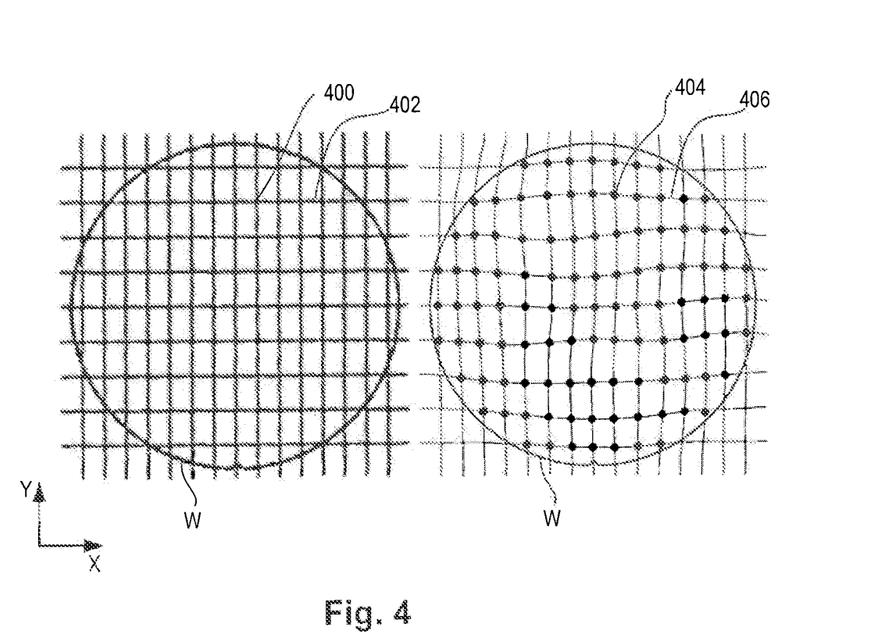
FIGS. 4 and 5 illustrate the principles of advanced alignment measurements and wafer grid corrections applied in embodiments of the present invention.
Figure 5:
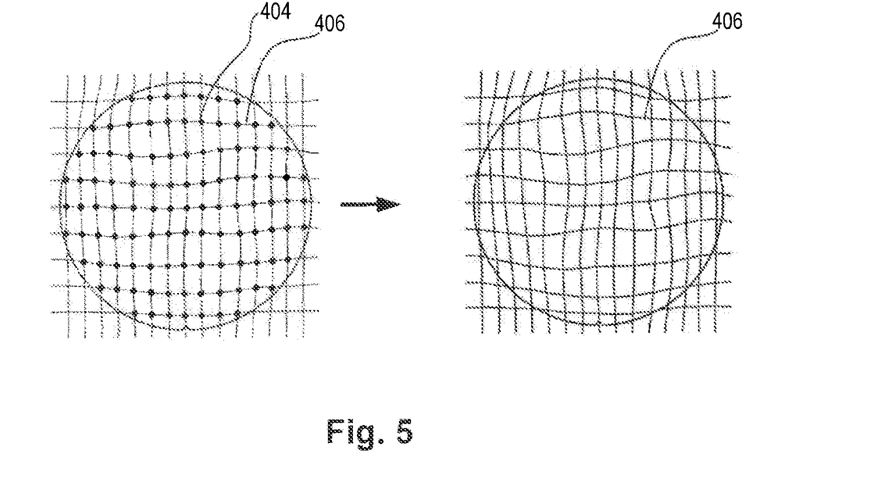

FIGS. 4 & 5 illustrates the form of alignment information that can be used to correct for wafer grid distortion as measured by the alignment sensor AL on alignment marks (targets) 400 in a previous layer on wafer (substrate) W. Each target has a nominal position, defined usually in relation to a regular, rectangular grid 402 with axes X and Y. Measurements of the real position 404 of each target reveal deviations from the nominal grid.

As illustrated in FIG. 5 the measured positions 404 of all the targets can be processed numerically to set up a model of a distorted wafer grid 406 for this particular wafer. (In the example illustrated, the straight lines of the nominal grid have become curves, indicating use of a higher order (advanced) alignment model. It goes without saying that the distortions illustrated are exaggerated compared to the real situation.) Alignment is a unique part of the lithographic process, because it is the correction mechanism able to correct for deviations (distortions) in each exposed wafer. The alignment during a current layer exposure measures positions of alignment targets formed in a previous layer. However, the current state of the art in lithography is to perform alignment without re-using grid information measured for exposure of any previous layer.

When the alignment models used in successive layers are equally complex, their corrections will generally agree and good overly performance is obtained. When alignment models are not equally complex between layers, however, an additional overlay penalty results directly from the different corrections applied using those models. The consequence of this is that if, for a certain product layer, an advanced alignment model has been applied, the subsequent layers, which directly align to that product layer and have critical overlay (e.g., contact to gate), also have to apply an identical or even more advanced alignment model. This is because the wafer grid correction applied for the previous layer means that the features applied in that layer are aligned with the distorted grid 406, including the curves or other higher order distortions imposed by the use of the advanced alignment model.

For coming production nodes (for example 28 nm and below), it is believed process-induced wafer grid deformation will become a more significant contributor to overlay error. Consequently the overlay of any critical layer should ideally be controlled with advanced alignment models. At the same time, it is known that the usage of advanced alignment models increases the need for alignment information and decreases productivity, simply because more alignment marks have to be measured to secure sufficient data as input for the complex applied alignment model.

When advanced alignment is used (to meet the overlay requirement), the subsequent layer has to follow this per wafer alignment induced wafer grid corrections to meet overlay specifications. This will continue for all subsequent product layers until overlay can absorb the penalty. Therefore some problems are:

An overlay penalty when not using (equally) advanced alignment models in subsequent layers. This is acceptable only if the subsequent layer does not have a tight overlay requirement.

A possible throughput penalty when measuring many alignment marks for using the same or more advanced alignment model. The applied alignment measurement scheme has to fulfill the requirements of the advanced alignment model in terms of number and location of alignment marks to be measured.

There is also a possible overlay penalty when the time between exposing successive layers is significant and therefore the performance of the alignment sensors and other parts of the lithography apparatus have drifted significantly between the layers. To address this type of error, process corrections and feedback scanner control mechanisms have been developed. These mechanisms, which are well known in themselves, provide additional corrections based on measuring previously processed substrates using separate metrology apparatus (not shown in FIG. 1).

Figure 6:
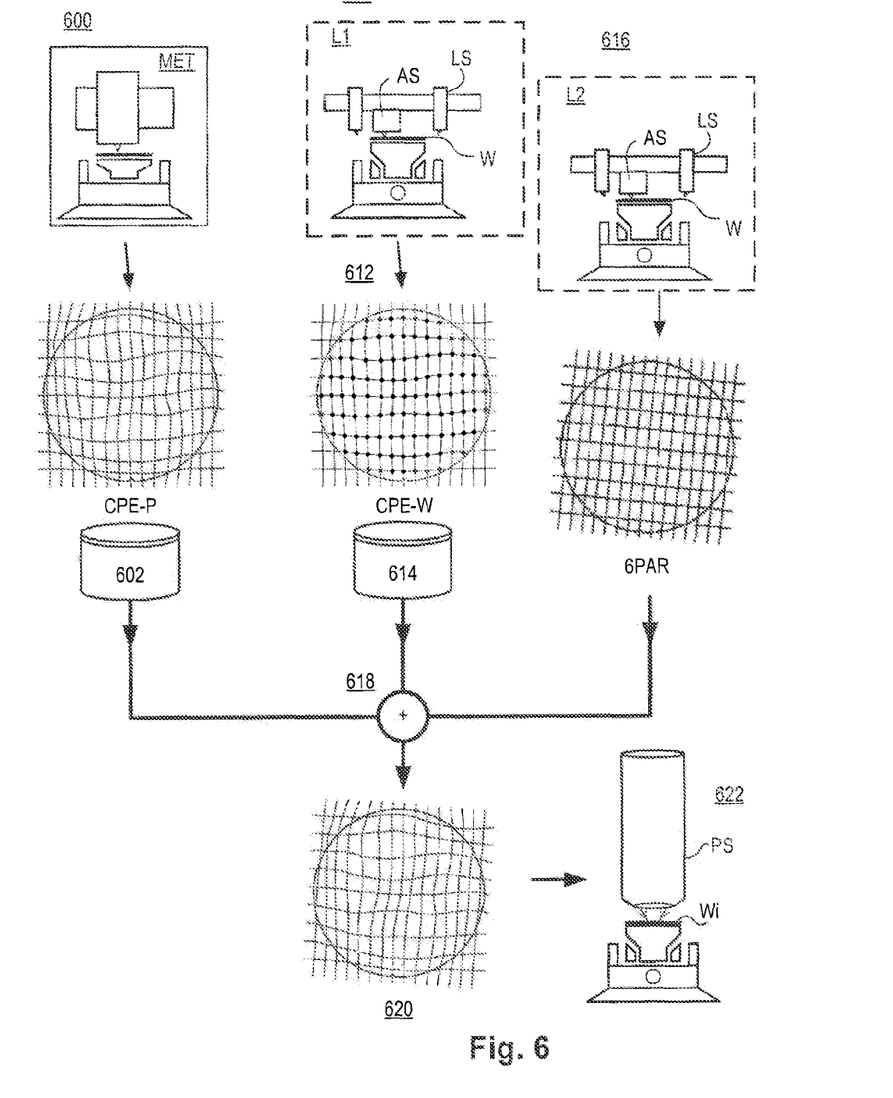
FIG. 6 illustrates a lithographic process forming a first application example and embodiment of the present invention.

FIG. 6 illustrates part of a device manufacturing method in which an advanced alignment model is applied in a first layer, while avoiding the need to apply (equally) advanced alignment models in subsequent layers. This is done by re-using information generated by the apparatus when measuring the first layer. This will avoid the throughput penalty and, subject to other mechanisms correcting any drift that occurs in the meantime, it achieves the same overlay performance as when using an advanced alignment model for the subsequent layer(s). In summary, when advanced alignment models have been used in a previous layer, information from the alignment marks in the previous layer is used to construct a wafer grid correction that is stored and used during exposure of a subsequent layer in the form of a correction per exposure (CPE) recipe for each wafer. This is valid for 'simple' advanced models like HOWA but also for the very complex models currently being developed, such as RBF. Known lithographic apparatuses provide for correction recipes for a range of process corrections, and it is therefore a matter of programming to provide an additional CPE component for the purpose of implementing the improvements disclosed in this application.

The process illustrated in FIG. 6 comprise the following steps:

600: Prior to exposure of the current wafer or lot of wafers, the lithographic apparatus and related processing equipment have been set-up, calibrated, used, monitored and re-calibrated using data from a mixture of test wafers, product wafers and the like, in a known manner. Overlay and other performance parameters may have been measured using separate metrology apparatus MET. The end result of this calibration and control effort is a process correction recipe CPE-P (process CPE) stored in a database 602 for the apparatus. To represent the corrections as a single recipe is a great simplification, as the person skilled in the art will understand. The corrections in practice are tailored to the type of lithographic apparatus, specific lithographic apparatus, properties of the substrates, resist materials, development steps, the nature of the patterns to be applied, which performance parameters are to be optimized and so forth. Many sub-recipes specific to these different variables are generated and combined. For the purpose of the present description, they can be represented as a single recipe CPE-P, which is part of the recipe data 306 shown in FIG. 3.

610: Measurements for an advanced alignment model are taken using alignment sensor AS when exposing a first critical layer (L1) on wafer W (measurement step 302 the exposure process illustrated in FIG. 3).

612: The applied wafer grid correction from the advanced alignment model is stored as a per wafer CPE recipe CPE-W in a database 614, so that it can be re-used for the particular wafer W. (Data path 332 in FIG. 3 corresponds.)

616: When the time comes to expose a subsequent critical layer (L2) on the same wafer W, alignment marks sufficient for a standard alignment model are measured, being much fewer than for the advanced model used on layer L1. Alternatively, alignment marks sufficient for a 'simpler' advanced model are measured. The principle is simply that the model for layer L2 requires fewer measurements than the one used on layer L1. For example, even using HOWA models for both layers, the number of polynomial orders could be reduced for layer L2, without changing the basic form of the model. For the present example, it will be assumed that a standard 6-parameter model is applied for the layer L2, and these corrections are labeled 6PAR in the drawing.

618: For exposure of second critical layer L2, the stored correction recipes CPE-P and CPE-W are retrieved, and combined with the simpler corrections 6PAR just measured to obtain a complete set of corrections 620.

622: The complete corrections are applied in the lithographic apparatus exposure process to apply the desired pattern to target portions of the wafer W, forming the desired features of layer L2 on top of the features of the previous layer L1.

The process illustrated can be automated for ease of use. It reduces the overlay by exploiting an advanced alignment model without the expected throughput penalty, by storing the grid correction needed for good overlay as a sub-recipe rather than by depending each time on new alignment information. It is possible that the measurement performance of the alignment sensors will drift over time. Such drift will generally have mainly lower order (zero-th and first order) terms, and can be compensated by the automatic process control system (not illustrated).

Additional benefits of the novel process in practice include that automated grid correction is provided within the same cluster of apparatuses and control computers concerned directly with lithography, and does not require so much involvement of a separate 'performance control' cluster.

Note that the per wafer correction CPE-W is or can be made substantially independent of process factors, just as the process correction CPE-P is (hopefully) independent of wafer-specific effects. This allows the stored advanced alignment corrections to be applied not just on the same lithographic apparatus but also on other apparatuses that might be used for different product layers in the overall device manufacturing process. Corrections appropriate to different lithographic exposure techniques such as EUV/DUV, immersion/dry, can be combined with the wafer correction sub-recipe as appropriate to each exposure, without repeating the detailed measurement required for advanced alignment in each machine.

Application Example

Re-Use of Grid Information Between Wafers

The principles illustrated in FIG. 3 can also be applied to obtain a more flexible gathering and use of alignment data between wafers, to better describe and correct the wafer grid. This is particularly applicable to improve overall alignment (overlay) performance across a batch or 'lot' of similar product wafers. The inventors have recognized that a conventional alignment implementation has the following drawbacks:

- Throughput considerations typically restrict the number of marks measured to a few tens of mark pairs (one mark pair measures X and Y position). With so many mark pairs, the wafer is only partly characterized. More mark pairs are usually needed to fully characterize the wafer. For example, 80-300 mark pairs might be needed to exploit the potential of advanced correction models.
- Even if the grid correction 'fingerprint' is similar for all wafers of the lot or a subset, using only the alignment data of only one wafer is potentially inaccurate to describe the fingerprint and is not supported by current control software.
- Repeatedly measuring the same subset of marks on different wafers across the lot does not increase knowledge of the grid.

In general, these drawbacks limit the effectiveness of modern 'feed-forward' correction techniques to improve overlay on product. The industry trend is to use more and more feedforward corrections. For instance, mask metrology equipment nowadays provide data characterizing the registration and CD mask fingerprints. This enables the feedforward generation of intrafield corrections during exposure of subsequent substrates. This application example enables benefits of feed-forward and feedback correction to be obtained using the alignment sensors of the lithographic apparatus as the metrology sensor.

Figure 7:
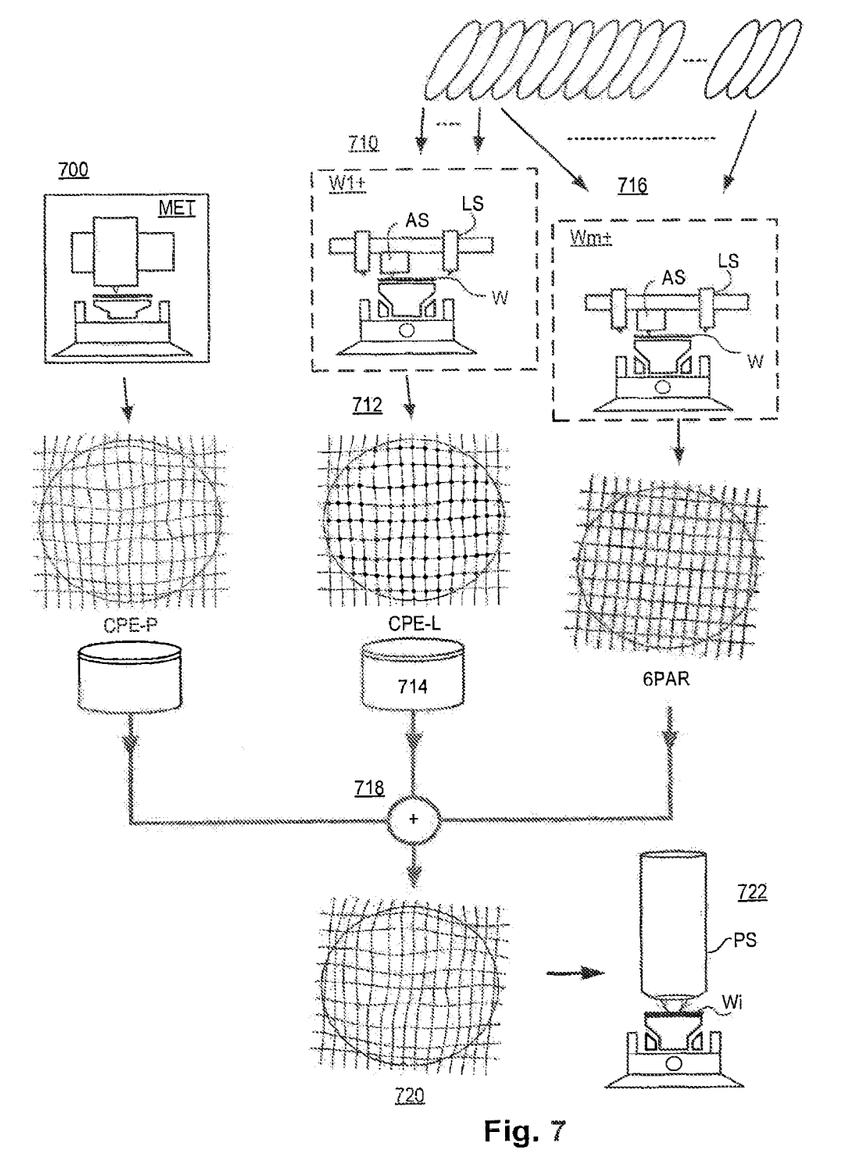
FIG. 7 illustrates a lithographic process forming a second application example and embodiment of the present invention.

FIG. 7 illustrates a process that takes advantage of the in line alignment taking place on the measurement side to generate interfield corrections applied on the exposure side. Intrafield corrections can be added as an extension to this concept. The granularity of corrections may be per lot, down to corrections per wafer within or across lots.

Steps 700 etc. are broadly the same in concept as the corresponding steps 600 etc. of FIG. 6. Whereas the example of FIG. 6 concerned the application of corrections measured from a previous layer on a same substrate (wafer), the present example illustrates the aggregation and/or re-use of corrections measured from different wafers within a same lot, corresponding to data path 330 in FIG. 3. This concept may even be extended to different lots within a same product line. For simplicity, in the FIG. 7 example, it is assumed that FIG. 7 refers to processing of a single layer within the overall device manufacturing process. The techniques of FIGS. 6 and 7 can be combined together if desired, when multiple layers are considered.

The changes related to the conventional alignment and exposure sequence for one lot of wafers are as follows. The first wafer or first few wafers in the lot are treated differently to other wafers in the lot. The number of wafers treated differently is a matter to be determined by design and experience, as will be explained.

At 710, the first few wafers (W1+) are extensively aligned while being exposed by the process outlined in FIG. 3. All alignment marks per field are measured in all fields or in a significant subset of fields, such as 30%. As a possible extension of this concept, where plural marks are available per field one can make sufficient measurements for accurate intrafield corrections, as well as wafer scale (interfield) corrections.

The number of wafers measured in step 710 depends firstly on the averaging required to eliminate wafer-specific aberrations. More measurements my be desirable also if there are some processing-induced intra-lot distributions. For example if it is known that the subsequent processing of the lot will be divided between two etching chambers one may expect a bimodal distribution of the statistics. In the subsequent description, we refer to a 'lot', while noting that in practice we mean to refer to a 'processing subset' that may be a subset of a manufacturing lot (typically 25 wafers), and/or may include wafers from more than one manufacturing lot, if their properties are sufficiently similar. At 712 the extensive measurements on the first few wafers are combined statistically to obtain a correction per exposure recipe CPE-L that is statistically applicable to the remaining wafers (Wm+) of the lot. This recipe is stored in a database 714.

The extra time for this extensive alignment on the first wafers is compensated in that the first few wafers are extensively aligned and corrected, minimizing the need for re-work, which arises normally at the start of a lot. Note that such extensive alignment may be reduced if similar lots have been earlier aligned and exposed. A lot correction recipe CPE-L produced by measurement of that previous lot can be used as a first estimate of the correction for the current lot. Combining this technique with that shown in FIG. 6, the lot correction recipe can be based on measurements made of a previous layer.

At 716 the conventional measurement-exposure cycle for the remaining wafers (Wm+) begins. Each of these remaining wafers is measured only enough to generate a simpler model of its wafer grid, for example the 6-parameter model. At 718, the stored lot correction recipe CPE-L is retrieved and combined with the simpler model to obtain a full set of corrections 720 for the to-be-exposed wafer. Process corrections sub-recipes CPE-P are also combined as before.

In an embodiment where the lithography tool has a specific fingerprint on the exposure side e.g., immersion or Scan Up Scan Down (SUSD) or Step Left Step Right (SLSR), this fingerprint is earlier characterized and added on top of the grid defined on the measurement side. This can be part of the process correction recipe CPE-P.

Applying the process of FIG. 7 can bring the following benefits:

- Better overlay and potentially improved overlay across the lot since corrections are getting better from wafer 1 onward, and/or from lot to lot.
- Better overlay since finer granularity of corrections is possible, down to corrections per wafer.
- New products do not require 'send-ahead' wafers since full alignment of the first wafers enable a first time right interfield and intrafield corrections.

The last benefit can be particularly advantageous in the context EUV lithography (extreme ultraviolet), where the lithographic apparatus is contained in a vacuum environment. Even for a new product, there is no need for wafers to leave the system.

Figure 8:
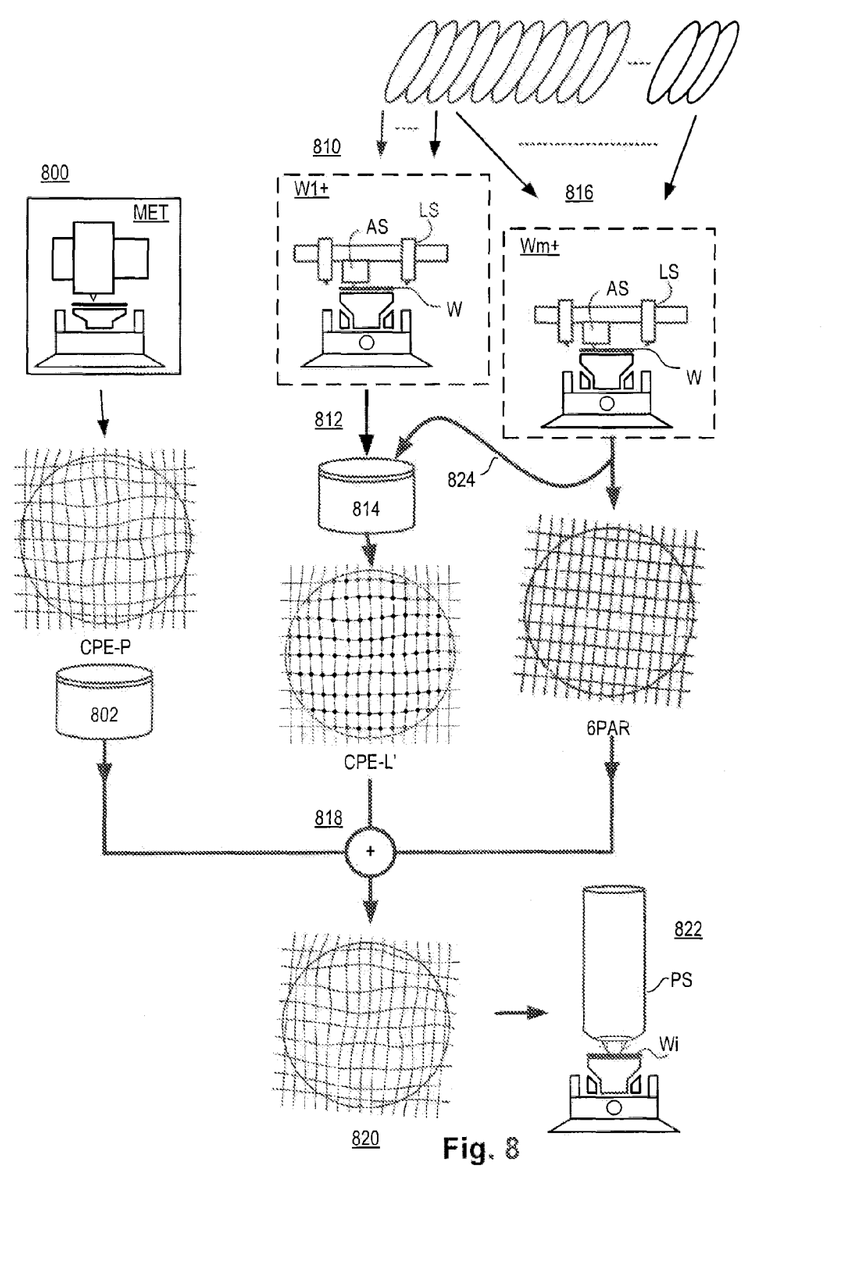
FIG. 8 illustrates a modification of the second application example and embodiment of the present invention.

FIG. 8 shows a modified version of this application example, in which steps 800 to 822 correspond generally with the like-numbered steps 700 to 722 in FIG. 7. All the above description of principles, implementation and optional features apply to FIG. 8 as to FIG. 7, except for differences that will now be described. For a first difference, whereas in FIG. 7 the advanced correction recipe CPE-L is generated from alignment data of the first few wafers and then stored in the database 714, in FIG. 8 the alignment data itself is stored in database 814, and the advanced correction recipe CPE-L is generated at the time of exposure. This involves a processing overhead, compared with calculating the correction recipe only once, but this overhead is no greater than would be incurred applying the advanced correction model to each wafer Wi. If it is the measurement overhead, rather than the processing overhead, that makes use of the advanced model unattractive, the processing overhead is not a problem.

Based on the first difference, a second difference can be added, which enhances accuracy of the modeling and correction progressively through the exposure of the lot. As shown by data path 824, the results of alignment measurements made during each subsequent exposure can be combined with previous measurements to create an enhanced set of measurement data in database 814. This enhanced set of data can be used in turn to calculate an enhanced correction recipe, which is labeled CPE-L' by way of illustration. That is to say, wholly or partially re-calculating the correction recipe for a subsequent wafer allows the correction recipe to evolve in response to new measurements made on each wafer, or a subset of wafers if preferred. In one embodiment, the alignment mark selection in step 816 is different from wafer to wafer, in order to fully characterize the (average) wafer grid step by step. This may be true between wafers in step 816 and in step 810 as well. Since a few tens of mark pairs are measured per wafer, the change of mark location does not negatively impact overlay, and nor does it affect throughput. The measurements at 816 could alternatively simply repeat the same measurements as on previous wafers, and improve statistical accuracy. However, the opportunity to add different mark selections allows a richer characterization of the grid, without the customary increase in measurement overhead per wafer. If desired, oldest data may be 'forgotten' from the model.

In the version of the method illustrated in FIG. 8, the measurement data collected in step 816 can be used separately as part of the basis for the advanced correction of higher order distortions separately, and as the whole basis for a standard correction labeled 6PAR, which corrects for the position of the wafer on the substrate support WTa/WTb, and first order distortions. The use of the data in the advanced model should be done in such a way that corrections that will be made by the standard model are not duplicated (i.e., over-corrected) by being included in the advanced model recipe also. One technique for this would be to subtract the standard model corrections (6PAR) from the measurements, before adding them to the database of measurements used for the advanced model. Another technique would be not to calculate the standard (6PAR) and advanced recipes separately, but to calculate a single, advanced model on the basis of all the collected data.

The steps and data flows indicated in FIGS. 6 to 8 are not intended to restrict the practical implementation, but rather to illustrate the principles of the novel techniques disclosed herein. For example, the data stored in the database 814 for re-use in the recipes CPE-L, CPE-L' etc. may be raw position information measured from alignment marks, it may be a finished correction recipe or it may be intermediate (semi-processed) data. The skilled reader can readily select the detailed implementation.

The application examples represented generally by FIGS. 7 and 8 are adaptable and can be made beneficial in the following cases: lots with multi-modal distribution due to multiple processing chambers; processing steps of a type that induce local wafer deformation as a significant contributor to overlay.

Implementation

Figure 9:
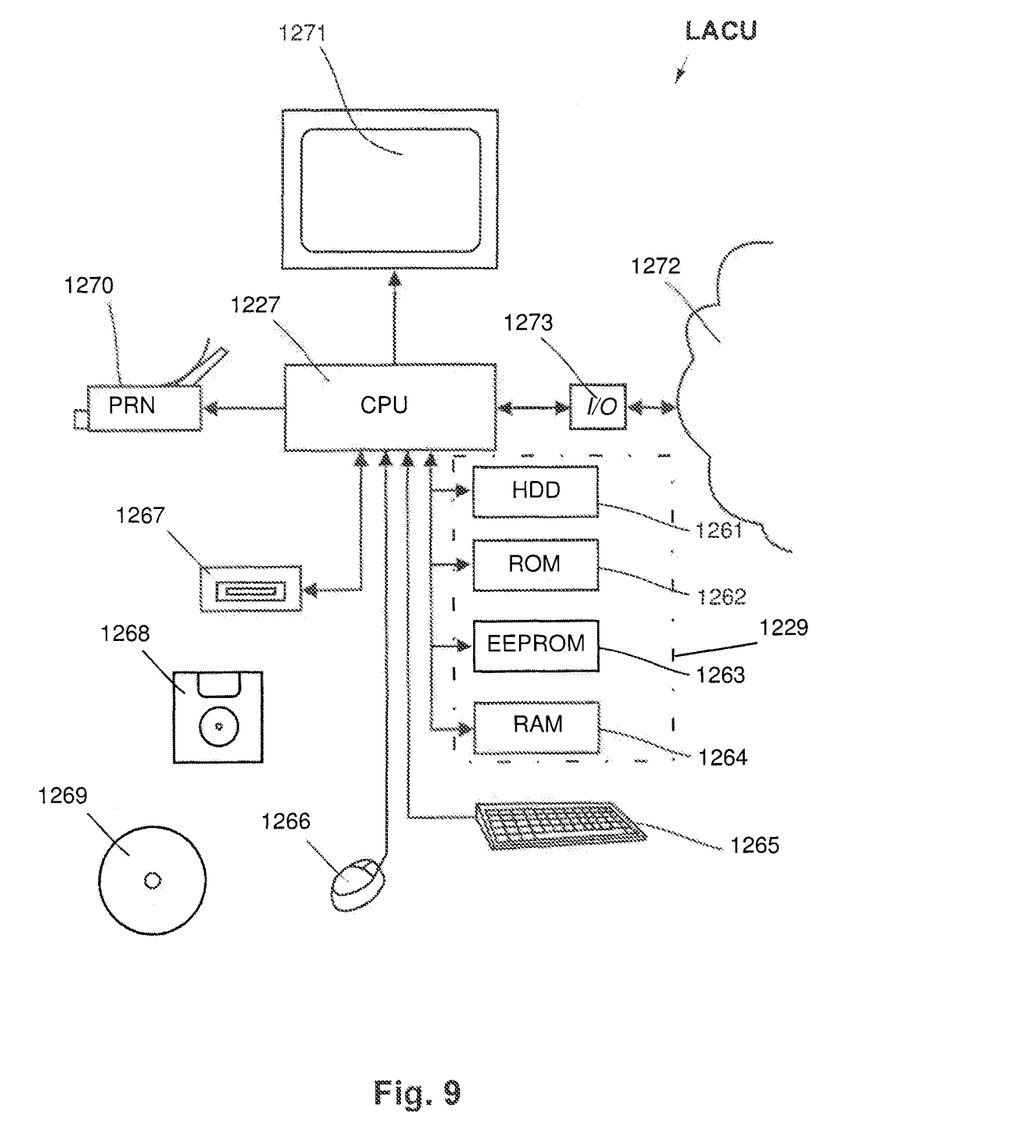
FIG. 9 illustrates computer system hardware useful in implementing processes shown in FIGS. 3 to 8.

The steps of the methods described above can be automated within the lithography apparatus control unit LACU shown in FIG. 1. This unit LACU may include a computer assembly as shown in FIG. 9. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 1229 connected to processor 1227 may comprise a number of memory components like a hard disk 1261, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g., in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "field"/"die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A lithographic apparatus configured to transfer a pattern from a patterning device onto a substrate, the lithographic apparatus comprising:
   a patterning subsystem configured to apply the pattern from the patterning device to a portion of the substrate held at a patterning location;
   a substrate support configured to hold the substrate while the pattern is applied;
   a measurement subsystem configured to measure locations of a first set of alignment marks and a second set of alignment marks on the substrate; and
   a controller configured to:
      operate the lithographic apparatus to apply the pattern at a desired location on the substrate held on the substrate support;
      generate a first correction information based on the locations of the first set of alignment marks measured by the measurement subsystem after loading the substrate on the substrate support;
      retrieve from a data storage device a second correction information that is based on the locations of the second set of alignment marks measured by the measurement subsystem prior to loading the substrate on the substrate support; and
      use the first and second correction information in combination to position the applied pattern at the desired location.

2. The lithographic apparatus of claim 1, wherein the controller is further configured to:
   process the measurements of the first set of alignment marks to generate a first alignment model; and
   process the measurements of the second set of alignment marks to generate a second alignment model, the second alignment model being different from the first alignment model.

3. The lithographic apparatus of claim 1, wherein the second correction information comprises one of a polynomial alignment model, a zone-alignment model and a radial basis function model.

4. The lithographic apparatus of claim 1; wherein the controller is further configured to:
   generate the second correction information based at least partially on measurements of the second set of alignment marks made using the measurement subsystem while applying the pattern to the substrate during a previous lithographic step; and
   store the second correction information in the data storage device.

5. The lithographic apparatus of claim 1, wherein the controller is further configured to:
   generate the second correction information based at least partially on measurements of a third set of alignment marks made using the measurement subsystem on another substrate to which the pattern has been applied during a previous lithographic step; and
   store the second correction information in the data storage device.

6. The lithographic apparatus of claim 1, wherein the controller is further configured to:
   process measurements made after the substrate is loaded with measurements made in a previous lithographic step.

7. The lithographic apparatus of claim 1, wherein:
   the lithographic apparatus comprises at least two substrate supports; and
   the controller is configured to:
      perform patterning on another substrate using one of the at least two substrate supports; and
      concurrently perform measurements of locations of alignment marks on the substrate using the other of the at least two substrate supports, respectively.

8. The lithographic apparatus of claim 1, wherein the controller can be implemented by a data processing unit configured to execute a non-transitory computer program containing one or more sequences of machine-readable instructions.

* * * * *